United States Patent [19]

Arthur et al.

[11] Patent Number: 4,849,284

[45] Date of Patent: Jul. 18, 1989

[54] ELECTRICAL SUBSTRATE MATERIAL

[75] Inventors: David J. Arthur, Norwood, Mass.; John C. Mosko, Wilmington, Del.; Connie S. Jackson, Thompson; G. Robert Traut, Killingly, both of Conn.

[73] Assignee: Rogers Corporation, Rogers, Conn.

[21] Appl. No.: 15,191

[22] Filed: Feb. 17, 1987

[51] Int. Cl.⁴ .................. B32B 5/16; B32B 17/02; B32B 27/20; H05K 1/00

[52] U.S. Cl. .................. 428/325; 428/405; 428/331; 428/421; 428/422; 428/901; 428/461; 174/68.5

[58] Field of Search ........... 428/325, 331, 421, 422, 428/901, 405, 461; 174/68.5, 110 FC, 117 A, 117 PC

[56] References Cited

U.S. PATENT DOCUMENTS

| | | | |
|---|---|---|---|
| 4,036,807 | 7/1977 | Atherton | 524/545 X |
| 4,251,432 | 2/1981 | Martin | 524/544 X |
| 4,335,180 | 6/1982 | Traut | 428/422 X |
| 4,634,631 | 1/1987 | Gazit et al. | 428/422 X |
| 4,647,508 | 3/1987 | Gazit et al. | 428/422 X |
| 4,696,851 | 9/1987 | Pryor | 428/901 X |

Primary Examiner—Ellis P. Robinson
Assistant Examiner—Susan S. Rucker
Attorney, Agent, or Firm—Fishman, Dionne & Cantor

[57] ABSTRACT

A ceramic filled fluoropolymer-based electrical substrate material well suited for forming rigid printed wiring board substrate materials and integrated circuit chip carriers is presented which exhibits improved electrical performance over other printed wiring board materials and circuit chip carriers. Also, the low coefficients of thermal expansion and compliant nature of this electrical substrate material results in improved surface mount reliability and plated through-hole reliability. The electrical substrate material preferably comprises polytetrafluoroethylene filled with silica along with a small amount of microfiberglass. In an important feature of this invention, the ceramic filler (silica) is coated with a silane coating material which renders the surface of the ceramic hydrophobic and provides improved tensile strength, peel strength and dimensional stability.

42 Claims, 8 Drawing Sheets

4,849,284

ELECTRICAL SUBSTRATE MATERIAL

BACKGROUND OF THE INVENTION

1. Field of the Invention

This invention relates to an electrical substrate material particularly useful as a circuit or wiring board substrate material and the printed wiring boards formed therefrom; and as an improved packaging system for integrated circuit chips. More particularly, this invention relates to a new and improved printed wiring board substrate comprised of a ceramic filled, microfiberglass reinforced fluoropolymer composite material which exhibits improved electrical performance over other printed wiring board substrate materials; and exhibits low coefficients of thermal expansion and relatively high compliance resulting in improved surface mount and plated through-hole reliability. The high degree of compliance of such a highly filled composite is an unexpected result. The ceramic filler is coated with a material (preferably silane) which renders the surface of the ceramic hydrophobic as well as providing other important and unexpected features. This ceramic filled, microfiberglass reinforced fluoropolymer composite material is also well suited for use in an improved packaging system for integrated circuit chips.

2. Description of the Prior Art

The performance of high speed computers is becoming increasingly limited by current methods of interconnection, from the printed wiring board (PWB) level on up. As ECL or GaAs logic devices are developed with high operating frequencies and shorter rise-times, the PWB substrate, particularly the material comprising the substrates, becomes an important component of circuit design, and substrate material selection is critical. Presently, two major issues for substrate selection are: (1) electrical performance; and (2) surface mount reliability.

For improved electrical performance, and lower dielectric constant, lower loss PWB materials are required, with these properties being stable over wide frequency and temperature ranges. PWB substrate materials currently used which provide reliable electrical performance for high speed applications include fluoropolymer (PTFE) glass composite materials.

In order to use surface mount technology reliably, a close match of the coefficients of thermal expansion (CTE) of the electronic package and the PWB substrate is required to reduce stress on solder joints. However, since the package and the board usually heat up at different rates, a close CTE-match may not be enough. A compliant (low modulus) substrate minimizes the stress on the solder joint resulting from differential strain between the package and the board. Such substrate materials demonstrating favorable coefficients of thermal expansion in the X-Y plane include polyimide/quartz and polyimide/KEVLAR composite materials.

However, no prior art approach has successfully provided a PWB substrate which has effective electrical performance as well as surface mount reliability. While PTFE/glass composites have excellent electrical properties, these materials have poor dimensional stability leading to poor surface mount reliability. Conversely, while polyimide/quartz and polyimide/KEVLAR have excellent surface mount reliability characteristics, these materials have relatively high dielectric constant and high loss (or dissipation factor) leading to poor electrical performance. In addition, no prior art approach has a Z-direction thermal expansion coefficient that is sufficiently close to that of copper so that high reliability plated through hole interconnections are achieved.

It will be appreciated that similar requirements (i.e., improved electrical performance and surface mount reliability) exist for surface mounted IC chip carrier packages as well as PWB substrates. Presently available chip carriers are generally comprised of ceramic materials or polymeric materials. Each of these materials have several known disadvantages in terms of electrical properties, environmental resistance, cost and size limitations and/or surface mount reliability.

U.S. Pat. No. 4,335,180, assigned to the assignee hereof, all of the contents of which are incorporated herein by reference, discloses an electrical substrate material which has both improved electrical properties and surface mount reliability. This material is described as a microwave circuit board comprised of a glass reinforced fluoropolymer filled with a ceramic. While suitable for its intended purposes, the microwave material of U.S. Pat. No. 4,335,180 suffers from an important deficiency in that the material exhibits a high degree of water absorption (i.e., the material is hydrophilic). As a result, moisture is absorbed into the microwave circuit leading to undesirable changes in the electrical and other properties of the circuit. Also, this material suffers from other drawbacks including low strength, poor copper adhesion and poor dimensional stability.

SUMMARY OF THE INVENTION

The above-discussed and other disadvantages and deficiencies of the prior art are overcome or alleviated by the elecrric substrate material of the present invention which provides improved PWB substrates and PWB constructions based upon said substrate; as well as providing improved integrated circuit chip carrier packages.

In accordance with the present invention, a PWB substrate material exhibiting improved electrical performance and excellent thermal expansion and compliancy properties comprises a ceramic filled fluoropolymer wherein the substrate material has the following properties:

(1) low dielectric constant;
(2) low loss;
(3) low thermal expansion; and
(4) chemically inert.

Preferably, the ceramic filler material comprises an amorphous fused silica ($SiO_2$) powder. Also, in a preferred embodiment, the ceramic filled fluoropolymer includes a small degree of glass microfiber reinforcement.

A critical feature of the present invention is that the ceramic filler is coated with a silane coating material which renders the surface of the ceramic hydrophobic thereby precluding undesirable water absorbtion into the PWB substrate. The silane coatings also contribute unexpected improvements to substrate/copper adhesion, strength and dimensional stability. These results were not expected since the silane coating does not chemically bond to the fluoropolymer matrix.

The coated ceramic, reinforced fluoropolymer of the present invention offers a low dielectric constant, for low signal propagation delay; low crosstalk and reduced board thickness; low loss at high frequencies, providing significant reduction in rise-time degradation;

excellent control of dielectric constant and thickness, vital for impedance control; and improved thermal conductivity for better heat dissipation. The fluoropolymer based PWB substrate of the present invention also exhibits low CTE in the X-Y plane and the material's inherent compliancy and dimensional stability make it suitable for surface mount applications; while its low CTE in the Z direction yields excellent plated-through-hole reliability. These excellent electrical and thermal expansion characteristics make is suitable for high speed digital and microwave applications requiring surface mounted devices and/or multilayer constructions.

A surface mountable IC chip carrier package comprised of the ceramic filled fluoropolymer composite described above will also exhibit improved electrical and surface mounting properties. In fact, the fluoropolymer composite chip carrier of the present invention may be compounded so as to match the thermal expansion of the printed circuit board thereby minimizing the thermal mismatch between the chip carrier and the PWB. The matching of thermal expansion is easier to achieve when the chip carrier of the present invention is used in conjunction with the PWB substrate of the present invention as the composition thereof will be identical or substantially identical. Also, and just as important, the chip carrier in accordance with the present invention provides many advantages so far as electrical characteristics thereof are concerned. The fluoropolymer composite chip carriers of the present invention are characterized by very low dielectric constant and dissipation factors when compared to prior art ceramic, epoxy or polyimide based chip carriers.

Finally, the silane coated ceramic filled fluoropolymer of the present invention may be utilized as a bonding ply or adhesive layer for bonding together circuit layers in a multilayer circuit board.

The above-discussed and other features and advantages of the present invention will be apparent to and understood by those skilled in the art from the following detailed description and drawings.

BRIEF DESCRIPTION OF THE DRAWINGS

Referring now to the drawing wherein like elements are numbered alike in the several FIGURES.

DESCRIPTION OF THE PREFERRED EMBODIMENT

Figure 1:
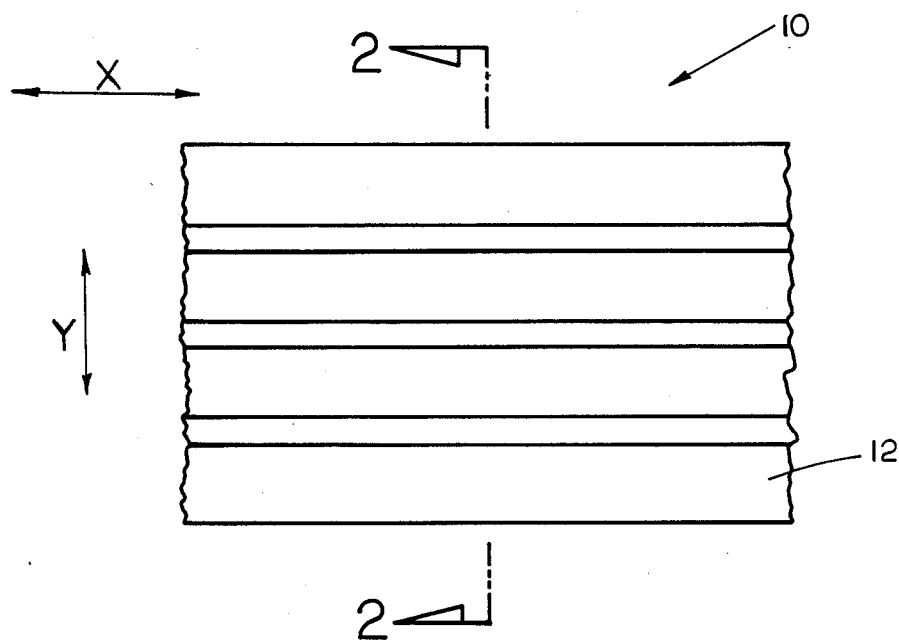
FIG. 1 is a plan view of a printed wiring board in accordance with the present invention.

The electrical substrate material of the present invention which is well suited for forming printed wiring board (PWB) substrate materials and integrated circuit chip carriers comprises a fluoropolymeric material filled with a coated ceramic material; the electrical substrate material having a low dielectric constant, low loss, low coefficient of thermal expansion, as well as being chemically inert. A preferred ceramic material which includes all of the above electrical and physical properties is silica ($SiO_2$), preferably amorphous fused silica powder.

An important and critical feature of the present invention is that the ceramic (i.e., silica) is coated with a material which renders the ceramic surface hydrophobic. It will be appreciated that ceramic material, particularly silica, is normally hydrophilic. It has been found that the ceramic filler used in previously discussed U.S. Pat. No. 4,335,180 leads to the undesired water absorbing properties, low strength, poor copper adhesion and poor dimensional stability of that prior art material. In a preferred embodiment, this coating is a silane material such as P-chloromethyl phenyl trimethoxy silane sold under the tradename "PROSIL 246" by Speciality Chemicals Company; "A-40" (chemical composition unknown) also manufactured by Speciality Chemicals Company; amino ethyl amino trimethoxy silane sold under the tradename "DC Z-6020" by Dow Corning Company; and a mixture of phenyl trimethoxy silane (90-95%) and amino ethyl amino propyltrimethoxy silane (5-10%) sold under the tradename "DC X1-6100" also by Dow Corning Company. Of these silane materials, DC X1-6100 has been found to be most preferred. In addition to precluding water absorption, the silane coating also leads to several other unexpected improvements including better adhesion, strength and dimensional stabiility (which will be discussed in more detail hereinafter). It has been found that a preferred silane coating for effecting these important features and advantages is 1% by weight of the filler (ceramic) material.

Preferably, the fluoropolymer used in the present invention is polytetrafluoroethylene (PTFE) although examples of other fluoropolymers include copolymers of fluorinated monomers such as hexa fluoropropene (HFP), tetrafluoroethylene (TFE), and perfluoro alkyl vinyl ether (PAVE). A small amount of microfiberglass (i.e., having a mean diameter on the order of 1 micron) is preferred for improved dimensional stability in the X-Y plane. It has been found that relative weight percentages of the respective component materials which provide the electrical and thermal advantages described below are 33-40 weight percent fluoropolymer; 55-71 weight percent ceramic filler with at least 1 weight percent (based upon the weight percent of the ceramic filler) silane coating and 0-2 weight percent microfiberglass. Also, it is clear from a review of TABLES 1-3 that the present invention is defined by a volume fraction of ceramic filler of about 50% of the total substrate material. A preferred composition for the of the present invention is 34-36% fluoropolymer (PTFE), 62-64% silica filler ($SiO_2$) having a 1% percent coating of silane thereon, and 1% microfiberglass. Additional ceramic (silica) filler (at the expense of PTFE) will result in a lower thermal expansion coefficient, and therefore improved surface mount reliability. However, increased ceramic filler level results in lower cohesive strength and higher dimensional change after etching circuit patterns. Small levels (1%) of microfiberglass seem to improve dimensional stability after etching; increased fiber content presents processing problems when making sheet thicknesses 2.5 mils and lower.

Figure 2:
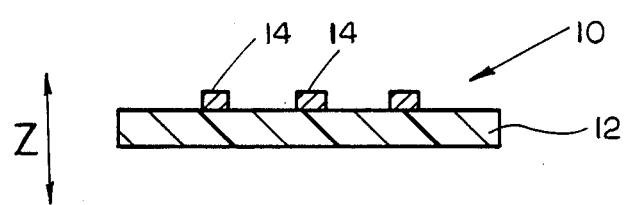
FIG. 2 is a cross-sectional elevation view along the line 2—2 of FIG. 1.

Turning now to FIGS. 1 and 2, a PWB is shown generally at 10. PWB 10 includes substrate 12 comprised of the ceramic filled fluoropolymeric material of the present invention as described above with a plurality of conductive traces 14 formed on substrate 12 using any suitable and well known technique.

Figure 3:
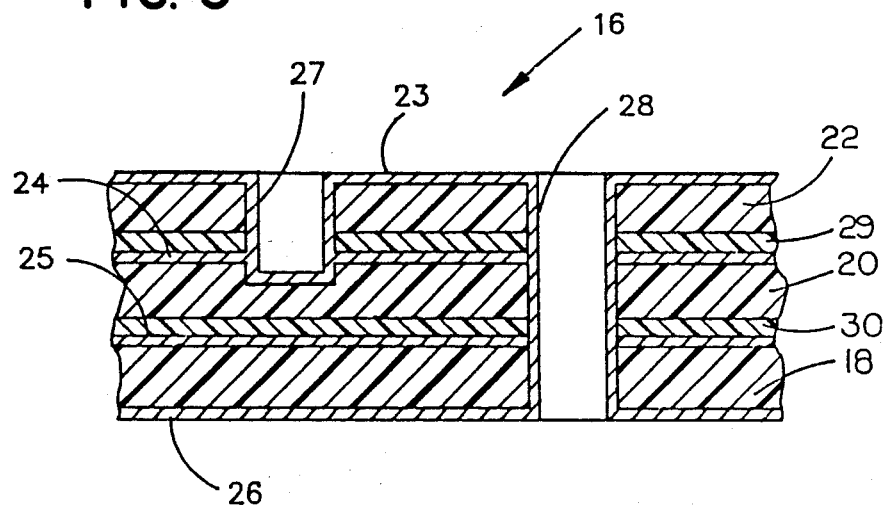
FIG. 3 is a cross-sectional elevation view of a multilayer printed wiring board in accordance with the present invention.

In FIG. 3, a multilayer circuit board is shown generally at 16. Multilayer board 16 comprises a plurality of layers of substrate material 18, 20 and 22, all of which are comprised of the ceramic filled fluoropolymeric material of the present invention. Each substrate layer 18, 20 and 22 has a conductive pattern 23, 24, 25 and 26 respectively thereon. Note that a substrate layer having a circuit pattern thereon defines a circuit substrate. Plated through holes 27 and 28 interconnect selected circuit patterns in a known manner.

In accordance with the present invention, separate sheets 29 and 30 of substrate material having the composition discussed above are used as an adhesive or bond ply to laminate individual circuit substrates together. In a preferred method of forming such a laminate, a stack-up of circuit substrates alternated with one or more layers of the bond ply is made. This stack-up is then fusion bonded at a high temperature whereby the entire multilayer assembly is melted and fused into a homogeneous construction with consistent electrical and mechanical properties throughout. Significantly, note that the adhesive bond ply layers 29 and 30 may be used to laminate circuit substrates comprised of materials other than the silane coated ceramic filled fluoropolymer of the present invention. Although, in a preferred embodiment, a multilayer circuit board includes circuit substrates and interleaved bond plys which are all comprised of the electrical substrate material of the present invention.

Figure 4:
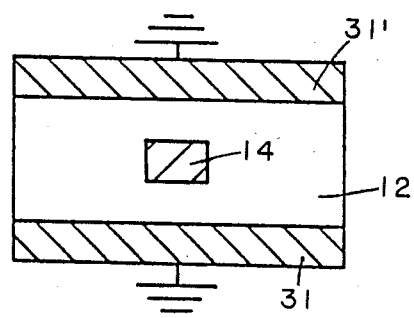
FIG. 4 is a cross-sectional elevation view of a stripline configuration of a printed wiring board in accordance with the present invention.
Figure 5:
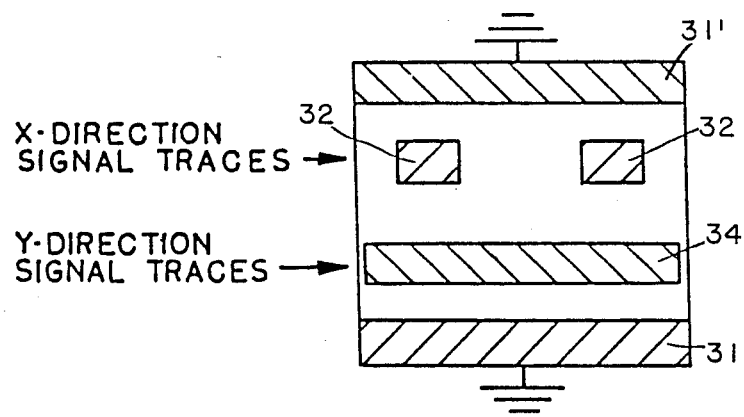
FIG. 5 is a cross-sectional elevation view of a "dual" stripline configuration of the printed wiring board in accordance with the present invention.

FIGS. 4 and 5 relate respectively to well known stripline and "dual" stripline configurations of the present invention. Thus, in FIG. 4, the printed wiring board 10 of FIGS. 1 and 2 is sandwiched between a pair of metal ground shields 31 and 31'. It will be appreciated that if only one ground shield 31 is utilized, a conventional microstrip configuration will be provided. FIG. 5 sets forth a derivation of the stripline of FIG. 4. In FIG. 5, conductors 32 and 34 are oriented in either the "X" direction or the "Y" direction defining a "dual" stripline configuration.

Figure 6:
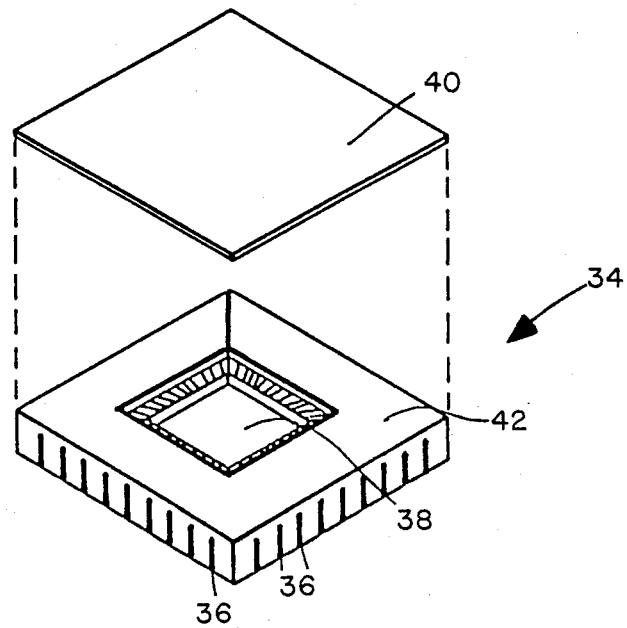
FIG. 6 is an isometric view of a chip carrier package in accordance with the present invention.

The favorable electrical and thermal properties of the electrical substrate material of the present invention make it well suited for use as a chip carrier package such as well known surface mounted leaded and leadless chip carrier and pin grid array (PGA) packages. For example, in FIG. 6, a leadless chip carrier package is shown generally at 34 and includes a plurality of conductive pads 36 about the periphery thereof and a cavity 38 for accepting an integrated circuit. A cover 40, also comprised of the circuit substrate described hereinabove, is provided on the top surface 42 of chip carrier 34.

The process used in manufacturing the electrical substrate material of the present invention is essentially the same as the manufacturing process described in detail in U.S. Pat. No. 4,335,180, which has previously been incorporated herein by reference. The primary difference between the two processes is the additional step in the present invention of coating the ceramic filler particles with a silane coupling agent. Typically, the ceramic filler particles are coated using the following procedure:

Adjust the pH of water to 3.0 by adding formic acid, and add 63 parts of the acidified water to 100 parts silica filler. Vigourously agitate the concentrated slurry in a high shear mixer (such as a Waring blender). When even dispersion of the filler is achieved, add the appropriate quantity of silane dropwise and continue mixing for about 10 minutes. Then the mixture is transferred to a stainless steel container, topped with a perforated cover, and placed in a hot air convection oven set at 120° C. to dry the water from the mixture, form covalent bonds between the silane coupling agent and the filler, and polymerize the silane coating per condensation reaction. Other less important differences between the manufacturing process of the present invention and that described in U.S. Pat. No. 4,335,180 include the following:

(1) Concentration of Cationic Flocculating Agent:

Required amount of flocculant varies with coating level and filler concentration. Typical levels of polyethylene imine flocculant for a composition of 63% $SiO_2$, 1% glass fiber, 36% PTFE, (coating being DC X1-6100):

| Silane Coating Level | Required Floculant Level |
| --- | --- |
| 0% | 0.2 parts per 100 parts filler |
| 0.25% | 0.13 parts per 100 parts filler |
| 0.5% | 0.11 parts per 100 parts filler |
| 2.0% | 0.10 parts per 100 parts filler |

(2) Lubricant Level:

Typically dipropylene glycol lubricant is used at a level of 19% weight percent based on total material weight.

(3) Y-Pass Calendering Conditions:

For thin ply production (about 0.0025"), multiple calender passes (up to five) are required through a gap of about 0.001" at roll bending pressure of 1900 psi.

(4) Lamination Cycle:

Typical conditions are; 1700 psi pressure for entire cycle; heat from room temperature to 700° F. at about 3° F./min, hold for 30 minutes, cool at about 1° F./min to 500° F., cool at max rate (about 20° F./min) to room temp.

EXAMPLES

The following non-limiting Examples 1-8 show how filler level, coating level, fiber type and level affect key properties for printed circuit boards. The examples were prepared in accordance with the method described hereinabove. The results outlined in Table 1 show that an optimal cross-section of properties occurs at 63% silica filler having been coated with a DC X1-6100 silane coating. This preferred level results in low porosity, very low water absorption, high copper adhesion, improved strength and better dimensional stability.

As is clearly shown in TABLE 1, the use of a silane coating dramatically decreases water absorption and increases peel strength, tensile strength and dimensional stability. These important features and advantages are both surprising and unexpected. Note that "Ash Content" is the amount of ceramic filler and fiber remaining in the material after combustion of the fluoropolymer. and the filler is reduced as is evidenced by decreases in strength and increases in thermal expansion coefficients. The preferred amount of silane is at least 1% and more preferably in the range of between 1 and 2% of the total weight of ceramic filler.

TABLE 1

| EXAMPLE | 1 | 2 | 3 | 4 | 5 | 6 | 7 | 8 |
|---|---|---|---|---|---|---|---|---|
| Coating type | | | | | DC X16100 | DC X16100 | DC X16100 | DC X16100 |
| Coating level (%) | 0 | 0 | 0 | 0 | 1.0 | 1.0 | 1.0 | 1.0 |
| Filler level (%) | 71 | 71 | 63 | 63 | 71 | 63 | 71 | 63 |
| Fiber type | Glass | Kevlar | Glass | Kevlar | Kevlar | Kevlar | Glass | Glass |
| Fiber Level (%) | 1.0 | 1.0 | 1.0 | 1.0 | 1.0 | 1.0 | 1.0 | 1.0 |
| Ash Content (%) | 10.5 | 68.1 | 59.9 | 61.0 | 69.2 | 60.9 | 70.5 | 62.1 |
| Density (g/cm$^3$) | 1.777 | 1.840 | 2.037 | 2.003 | 1.885 | 2.104 | 1.925 | 2.074 |
| Porosity (Vol %) | 18.1 | 14.7 | 6.1 | 7.1 | 12.6 | 2.4 | 11.3 | 4.4 |
| Water Absorption (%) 48 hr, 50° C. | 2.758 | 2.018 | 1.580 | 1.960 | 0.594 | 0.123 | 0.773 | 0.058 |
| Peel Strength (lb/inch) | 1.61 | 1.10 | 2.00 | 5.48 | 5.62 | 5.81 | 2.58 | 9.80 |
| Young's Modulus (kpsi) | 11.95 | — | 24.85 | 27.40 | 36.20 | 129.50 | 60.15 | 66.70 |
| Tensile Strength (psi) | 298 | — | 414 | 720 | 818 | 1695 | 956 | 1407 |
| X-Y CTE (0-120° C.) (ppm°C.$^{-1}$) | 12 | 10 | 17 | 15 | 10 | 19 | 11 | 17 |
| Z-dir CTE (0-120° C.) (ppm°C.$^{-1}$) | 6 | 7 | 15 | 16 | 15 | 20 | 10 | 23 |
| Dim. Stability, X-dir (mils/inch) | +3.986 | +3.417 | +2.483 | +2.820 | +2.596 | −0.144 | +1.884 | +0.705 |
| Dim. Stability, Y-dir (mils/inch) | +4.121 | +3.527 | +2.451 | +2.789 | +2.771 | −0.189 | +1.995 | +0.821 |
| Dielectric Constant | 2.64 | 2.75 | 2.83 | 2.78 | 2.76 | 2.91 | 2.84 | 2.85 |
| Dissipation Factor | .0023 | .0046 | .0026 | .0022 | .0017 | .0024 | .0034 | .0016 |
| Filler Volume Fraction (%) | 0.569 | 0.569 | 0.554 | 0.554 | 0.593 | 0.581 | 0.612 | 0.584 |

TABLE 2

| EXAMPLE | SILANE LEVEL (%) | ASH CONTENT (%) | WATER ABSORPTION 24 hr, 23° C. (%) | WATER ABSORPTION 48 hr, 50° C. (%) | PEEL STRENGTH (lb/inch) | YOUNG'S MODULUS (psi) | TENSILE STRENGTH (psi) | X-Y CTE, 0-120° C., (ppm °C.$^{-1}$) | Z-dir CTE 0-120° C., (ppm °C.$^{-1}$) | Filler Volume Fraction (%) (Assuming X1 = (ASH)/(100) − .01 where ASH = 2.0 g/cm$^3$) |
|---|---|---|---|---|---|---|---|---|---|---|
| 9 | 0 | 60.2 | 1.777 | 1.651 | 5.7 | 25,000 | 600 | 14 | 19 | approx. 0.546 |
| 10 | 0.25 | 60.4 | 0.312 | 0.305 | 7.2 | 143,000 | 1630 | 16 | 26 | approx. 0.547 |
| 11 | 0.50 | 60.8 | 0.124 | 0.121 | 8.0 | 125,000 | 1850 | 16 | 27 | approx. 0.551 |
| 12 | 1.0 | 61.0 | 0.111 | 0.096 | 6.8 | 132,000 | 1890 | 17 | 26 | approx. 0.553 |
| 13 | 2.0 | 60.2 | 0.108 | 0.076 | 11.1 | 81,000 | 1490 | 20 | 35 | approx. 0.546 |
| 14 | 4.0 | 56.7 | 0.105 | 0.080 | 15.1 | 61,000 | 1530 | 22 | 35 | approx. 0.513 |

In examples 9-14, the amount of silane coating is varied between 0% and 4.0% to show how changes in the level of silane effect key properties of the electrical substrate material of the present invention. As is clear from TABLE 2, even very low levels of silane (0.25%) will have reduced water-absorption and improved peel strength. Silane levels above 1% seem to favor coupling to the copper foil which result in further improvements to peel strength. However, above roughly 1% silane coating levels, the coupling between the fluoropolymer In Examples 15-19, four different types of thermally stable silane coatings are compared to a control having no silane coating. All coatings are done at 1% levels. As shown in TABLE 3, all coatings provide dramatic, suprising and unexpected results in terms of reducing water absorption, improving copper adhesion and improving strength. As mentioned, DC X1-6100 is the preferred coating due to thermal stability and consistency of the below listed favorable results.

TABLE 3

| EXAMPLES | COATING | ASH (%) | DENSITY (g/cm$^3$) | 24 hr, 50° C. (%) | 48 hr, 50° C. (%) | PEEL STRENGTH (lb/inch) | YOUNG'S MODULUS (kpsi) | TENSILE STRENGTH (psi) | DIELECTRIC CONSTANT | DISSIPATION FACTOR | Filler Volume Fraction (%) (Assuming X1 = (ASH)/(100) − .01 where ASH = 2.0 g/cm$^3$) |
|---|---|---|---|---|---|---|---|---|---|---|---|
| 15 | Prosil 246 @ 1% | 51.9 | 2.160 | 0.218 | 0.246 | 9.3 | 97 | 1200 | 2.84 | 0.0015 | approx. 0.507 |
| 16 | A-50 @ 1% | 50.8 | 2.168 | 0.681 | 0.690 | 8.8 | 102 | 1200 | 2.83 | 0.0017 | approx. 0.498 |
| 17 | DC X1-6100 @ 1% | 51.8 | 2.162 | 0.217 | 0.248 | 10.5 | 99 | 1300 | 2.84 | 0.0015 | approx. 0.506 |
| 18 | DC Z-6020 @ 1% | 52.6 | 2.150 | 0.569 | 0.575 | 9.9 | 120 | 1150 | 2.83 | 0.0016 | approx. 0.511 |

TABLE 3-continued

| EX-AM-PLES | COATING | ASH (%) | DEN-SITY (g/cm³) | 24 hr, 50° C. (%) | 48 hr, 50° C. (%) | PEEL STRENGTH (lb/inch) | YOUNG'S MODU-LUS (kpsi) | TENSILE STRENGTH (psi) | DI-ELEC-TRIC CON-STANT | DIS-SIPA-TION FAC-TOR | Filler Volume Fraction (%) (Assuming X1 = (ASH)/(100) − .01 where ASH = 2.0 g/cm³) |
|---|---|---|---|---|---|---|---|---|---|---|---|
| 19 | No Coating | 51.6 | 2.160 | | 0.895 | 7.8 | 91 | 900 | 2.83 | 0.0016 | approx. 0.504 |

Figure 7:
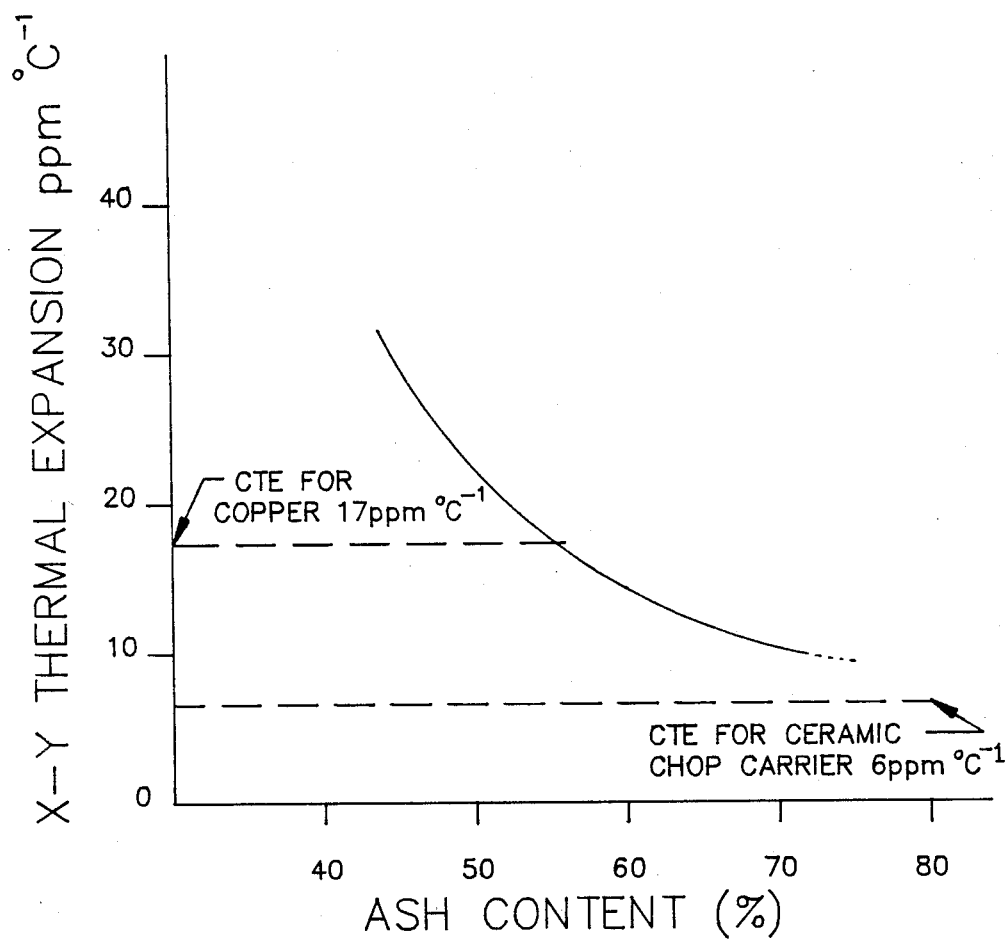
FIG. 7 is a graph of X-Y thermal expansion versus filler content.

The electrical substrate material of the present invention is highly filled with ceramic, preferably silica. FIG. 7 is a graphical representation showing the effect of filler level on the X-Y plane thermal expansion coefficient of the material of the present invention. The measurements were taken on a plurality of samples (having varying amounts of filler) as measured on a thermo-mechanical analyzer over a temperature range of 0°–120° C. It will be appreciated that although it is difficult to match the thermal expansion of ceramics, it has been demonstrated (see FIG. 10 discussed below) that CTE's in the 10–20 ppm °C.$^{-1}$ range can result in high solder joint reliability, as stresses are kept at a minimum due to the high degree of compliancy of the material of the present invention. Thus, as shown in FIG. 7, at relatively high percentages of ceramic filler, the CTE lessens and approaches that of ceramics.

Figure 8:
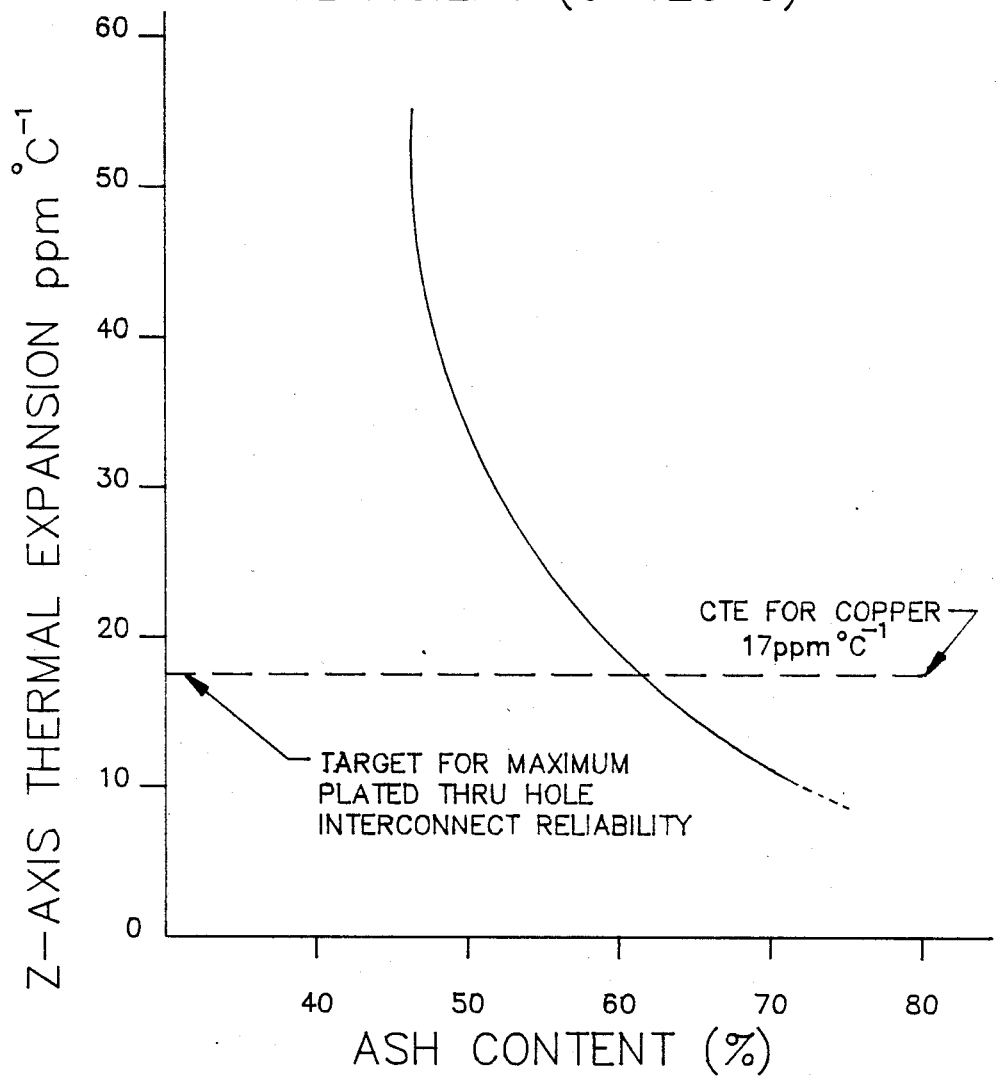
FIG. 8 is a graph of Z axis thermal expansion versus filler content.

FIG. 8 shows the effect of varying the amount of filler level on the Z-direction thermal expansion coefficient also as measured by a thermo-mechanical analyzer over a temperature range of 0°–120° C. Again, at high filler levels, the Z-direction CTE goes steadily downwardly (see also FIG. 11 discussed below). Significantly, as is evident in both FIGS. 7 and 8, the X-Y and Z direction CTE's may be tailored to favor copper, ceramic or other materials simply by adjusting filler levels.

Table 4 shows the effect of fiber level and filler size distribution on processing thin (i.e., 0.0015") sheet materials (all of the samples having a ceramic filler content of about 62%). Samples were made (1) with standard filler size distribution (mean particle diameter of roughly 10–15 μm); (2) with equal to or greater than 30 μm particles removed; (3) with 1% glass fiber; and (4) with no glass fiber. The results clearly show that manufacture of very thin sheet materials is much easier for compositions without glass fibers and without filler particles having a larger mean particle dimension.

TABLE 4

Effect of Fiber Level & Filler Size Distribution on processing of 0.0015" sheet materals

| | Standard Filler size distribution | Standard Filler w/ all particles 30 μm removed |
|---|---|---|
| 1% glass fiber | Many pinholes poor edge quality (tears) unable to reach 0.0015" in 5 calender passes | Few pinholes poor edge quality (tears) |
| 0% glass fiber | Many pinholes good edge quality | No pinholes good edge quality |

COMPARISON OF THE PRESENT INVENTION WITH PRIOR ART ELECTRICAL SUBSTRATE MATERIALS

The detailed evaluations of the electrical substrate material of the present invention relative to known prior art substrate materials are set forth below and are divided into two parts: electrical performance; and surface mount reliability. Wherever possible, the performance of the present invention (RO-2800) is compared to other prior art PWB substrate materials and integrated circuit chip carriers such as PTFE/microfiberglass, epoxy/woven glass, polyimide/woven glass, PTFE/woven glass, polyimide/woven quartz, and polyimide/Kevlar (a registered trademark of E.I. duPont de Nemours Co.).

I. ELECTRICAL PERFORMANCE

A. Propagation Delay

The silane coated ceramic filled fluoropolymer PWB substrate material in accordance with the present invention (RO-2800) is the lowest dielectric constant PWB material with respectable performance for surface mount applications, as will be demonstrated hereinafter. With a dielectric constant of 2.8–2.9, propagation delays can be reduced by as much as 30% compared with the woven glass fabric reinforced epoxy and polyimide materials, and by as much as 10% over polyimide laminates reinforced with quartz or Kevlar fabric. This data is summarized in TABLE 5. It will be appreciated that while PTFE/microfiberglass materials do exhibit lower dielectric constants and propagation delays relative to the present invention, the adverse thermo-mechanical properties of these materials make them unsuitable for surface mount applications.

TABLE 5

Effect of Dielectric Constant on Propagation Delay

| Dielectric Material | Dielectric Constant | Propagation Delay (nsec/foot) | Speed Efficiency* |
|---|---|---|---|
| Air | 1.0 | 1.0167 | 100% |
| PTFE/Microfiberglass | 2.2 | 1.5080 | 67% |
| RO-2800 (Present Invention) | 2.8 | 1.7012 | 60% |
| Polyimide/Woven Quartz | 3.35 | 1.8609 | 55% |
| Polyimide/Woven Kevlar | 3.6 | 1.9291 | 53% |
| Polyimide/Woven Glass | 4.5 | 2.1567 | 47% |
| Epoxy/Woven Glass | 4.8 | 2.2275 | 46% |

*Speed Efficiency = $\dfrac{\text{Propagation Delay Thru Air}}{\text{Propagation Delay Thru PWB}}$ B. Crosstalk Crosstalk can be defined as undesirable coupling of energy between signal traces. In high peformance digital computer systems, circuit densities are very high, resulting in small spacing between traces. As the line spacing decreases, crosstalk becomes a major problem.

In this comparison, the "dual" stripline geometry shown in FIG. 5 was used because of its widespread use in multi-layer constructions. The line widths were held constant at 0.005", and the total ground plane spacing was chosen to maintain a nominal characteristic impedance of 50 ohms when the X and Y direction signal layers were separated by 0.005" dielectric.

Figure 9:
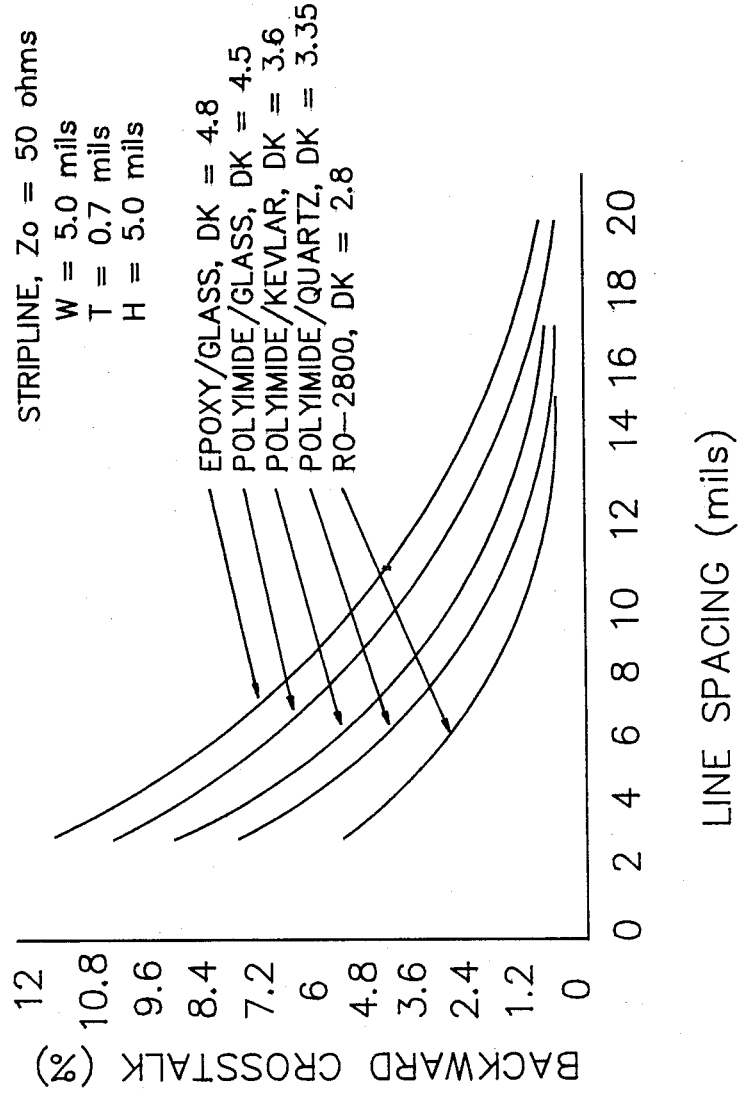
FIG. 9 is a graph of backward crosstalk versus line spacing for a printed wiring board in accordance with the present invention.

As is shown is FIG. 9, a 6 mil space between signal traces would result in less than 2% crosstalk for the present invention (RO-2800), compared to an 8 mil space required for polyimide/quartz and 11.5 mil space required for epoxy/glass. These differences are very significant in high performance applications, enabling circuit designers to route traces closer to one another when using the novel PWB substrate in accordance with the present invention.

C. Rise-Time Degradation

Rise-time degradation through the PWB becomes a significant problem when trace lengths are long and switching speeds are increased. The rise-time degradation for an RO-2800 (present invention) circuit was compared to some conventional PWB materials (epoxy/woven glass and polyimide/woven glass) and a high performance "microwave" material (PTFE/microfiberglass). Standard stripline constructions (see FIG. 4) were chosen, with line widths in the 3.9 to 5.9 mil range and Zo in the 49 to 70 ohms range.

A Tektronix 7854 oscilloscope with the 7S12 TDR plug-in module was used for all tests. Trace lengths were 19.6 inches long, the TDR rise-time was typically 25 psec and input rise-time was typically 137 psec.

The rise-time degradation data is shown in TABLE 6. From this data, two effects are noted:

(1) the effect of the dielectric material; and
(2) the effect of circuit construction.

The first effect can be attributed to the difference in dissipation factors for the various materials tested, particularly at high frequencies. Attenuation of the high frequency components of a signal pulse results in a less sharply defined pulse and therefore, rise-time degradation. PTFE/microfiberglass and RO-2800 laminates exhibit low dissipation factors well into the GHz range, with values at 10 GHz as low as 0.0008 and 0.002 respectively. Data describing the dissipation factor at high frequencies could not be found for the other materials tested. However, even at 1 MHz, the dissipation factors are in the 0.01 to 0.02 range. The tests show that RO-2800 (present invention) resulted in a 40 to 55% reduction in rise-time degradation compared with the polyimide/glass and epoxy/glass materials. As expected, the lowest loss material, PTFE/microfiberglass, resulted in the lowest rise-time degradation, exhibiting an 18% improvement over the present invention (RO-2800).

TABLE 6

| | Rise-Time Degradation | | | |
|---|---|---|---|---|
| Material | W(mils) | Zo(ohms) | Tr (psec) | Tr/L (psec/ft) |
| PTFE/Microfiberglass | 4.8 | 64 | 139 | 86 |
| PTFE/Microfiberglass | 5.1 | 79 | 111 | 68 |
| RO-2800 | 5.0 | 49 | 165 | 102 |
| RO-2800 | 4.4 | 51 | 165 | 102 |

TABLE 6-continued

| | Rise-Time Degradation | | | |
|---|---|---|---|---|
| Material | W(mils) | Zo(ohms) | Tr (psec) | Tr/L (psec/ft) |
| RO-2800 | 5.1 | 69 | 139 | 86 |
| RO-2800 | 5.2 | 75 | 139 | 86 |
| Epoxy/Woven Glass | 4.9 | 51 | 366 | 225 |
| Epoxy/Woven Glass | 4.7 | 75 | 303 | 187 |
| Polyimide/Woven Glass | 5.9 | 58 | 236 | 145 |
| Polyimide/Woven Glass | 3.9 | 74 | 259 | 159 |

Stripline circuits, trace length (L) = 19.6 inches
$Tr = (Tr_o^2 - Tr_i^2)^{\frac{1}{2}}$ = rise-time degradation
Tr/L = rise = time degradation per unit trace length D. Transmission Line Losses A number of transmission line parameters affect the attenuation of microwave signals in stripline, including: Zo, $\epsilon_r$, loss tangent or dissipation factor, conductor resistivity, surface finishes, conductor thicknesses, and circuit configurations.

Results for calculations on RO-2800 (present invention) and PTFE/microfiberglass materials for 50 ohm stripline with 5 mil line width using 1 ounce copper are shown in TABLE 7. PTFE/microfiberglass is used for microwave applications requiring low loss. As can be seen in the table, RO-2800 performed as well as the premiere microwave materials from 1 MHz to 10 GHz in this stripline construction. This particular construction was chosen because of the trend towards narrow lines for high speed digital packaging.

TABLE 7

| Transmission Loss Versus Frequency, RO-2800 Versus "Microwave Material" | | |
|---|---|---|
| | Transmission Loss (db/inch) | |
| Frequency (GHz) | RO-2800 | PTFE/Microfiberglass |
| 0.001 | $9.6 \times 10^{-5}$ | $9.5 \times 10^{-5}$ |
| 0.001 | $9.6 \times 10^{-4}$ | $9.5 \times 10^{-4}$ |
| 0.1 | $9.6 \times 10^{-3}$ | $9.5 \times 10^{-3}$ |
| 0.25 | 0.022 | 0.024 |
| 0.5 | 0.048 | 0.048 |
| 1.0 | 0.096 | 0.095 |
| 5.0 | 0.479 | 0.477 |
| 10.0 | 0.957 | 0.953 |

50 ohm stripline
5 mil line width, 1 ounce ED copper

II. SURFACE MOUNT RELIABILITY

Some key thermal/mechanical properties of several materials are listed in Table 8. The two materials listed at the bottom of the table are reference materials: alumina is often used as a chip carrier material, and copper is usually the metal conductor on a PWB. All of the other materials are PWB materials that can be separated into the following categories: fluoropolymer materials (PTFE/glass, RO-2800), specialty reinforcements (polyimide/quartz, polyimide/KEVLAR) and conventional materials (polyimide/glass, epoxy/glass).

TABLE 8

| | THERMAL/MECHANICAL PROPERTIES | | | | |
|---|---|---|---|---|---|
| Material | CTE-xy (ppm °C.') | CTE-z (ppm °C.') | Thermal Conductivity W/m/K | Modulus of Elasticity (Mpsi) | Density (lb/in³) |
| PTFE/glass | 24 | 261 | 0.26 | 0.14 | 0.079 |
| RO2800 | 16–19 | 24 | 0.44 | 0.1 | 0.072 |
| Polyimide/quartz | 6–8 | 34 | 0.13 | 4.0 | 0.07 |
| Polyimide/KEVLAR | 3.4–6.7 | 83 | 0.12 | 4.0 | 0.06 |
| Polyimide/glass | 11.7–14.2 | 60 | 0.35 | 2.8 | 0.066 |
| Epoxy/glass | 12.8–16 | 189 | 0.18 | 2.5 | 0.065 |
| Alumina | 6.5 | 6.5 | 16.8 | 37.0 | 0.13 |

TABLE 8-continued

THERMAL/MECHANICAL PROPERTIES

| Material | CTE-xy (ppm °C.') | CTE-z (ppm °C.') | Thermal Conductivity W/m/K | Modulus of Elasticity (Mpsi) | Density (lb/in$^3$) |
|---|---|---|---|---|---|
| Copper | 16.9 | 16.9 | 394 | 17.0 | 0.324 |

The present invention was evaluated for use in surface mount applications by thermal cycling test boards populated with leadless ceramic chip carriers.

Figure 10:
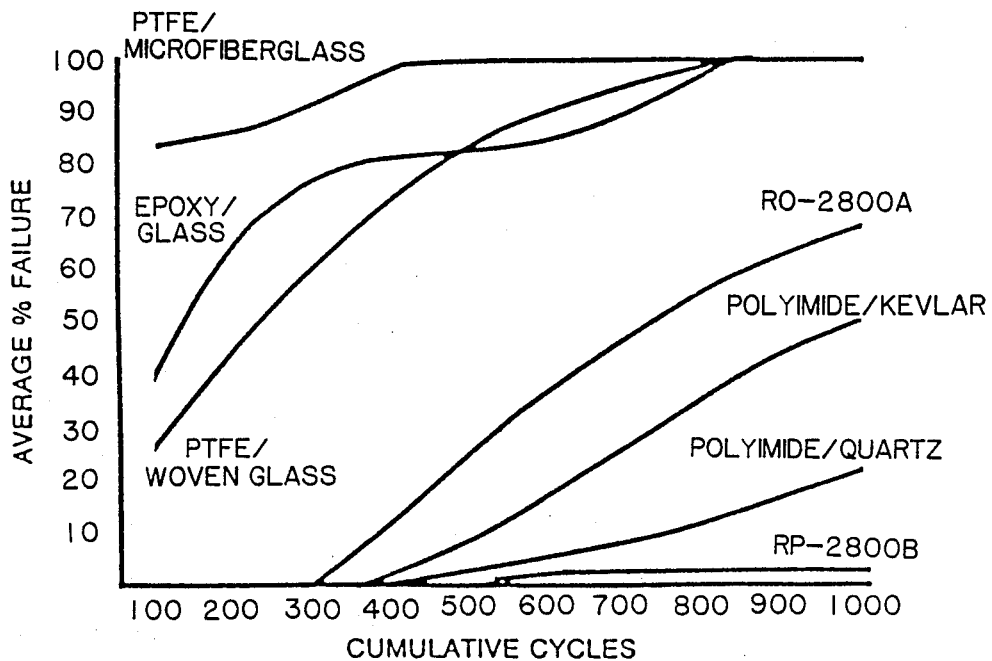
FIG. 10 is a graph showing solder joint reliability tests.

The compiled results of solder joint failure versus thermal cycle number for each material in Table 8 are graphically shown in FIG. 10. As shown, the performance of the present invention (RO-2800A) is superior to that of standard epoxy/glass substrates and glass-reinforced fluoropolymer materials, and only slightly less reliable than polyimide/Kevlar and polyimide-quartz boards. If additional filler is added to RO-2800 to reduce the X-Y CTE to approximately 10 ppm °C., then surface mount reliability can be even better than the polyimide quartz boards. A material with this additional filler is identified as RO-2800B in FIG. 10.

As the thermal expansion coefficient of the PWB approaches that of the ceramic chip carrier, the differential strain is reduced, resulting in reduced stress at the solder joints of surface mounted LCCC's. Although the CTE of the present invention is not as closely matched to ceramic chip carriers as some other substrate alternatives, its compliant nature plays a major role in reducing stress at the solder joint. This results in surface mount reliability that is comparable to these other materials for 28 and 68 I/0 LCCC's.

Figure 11:
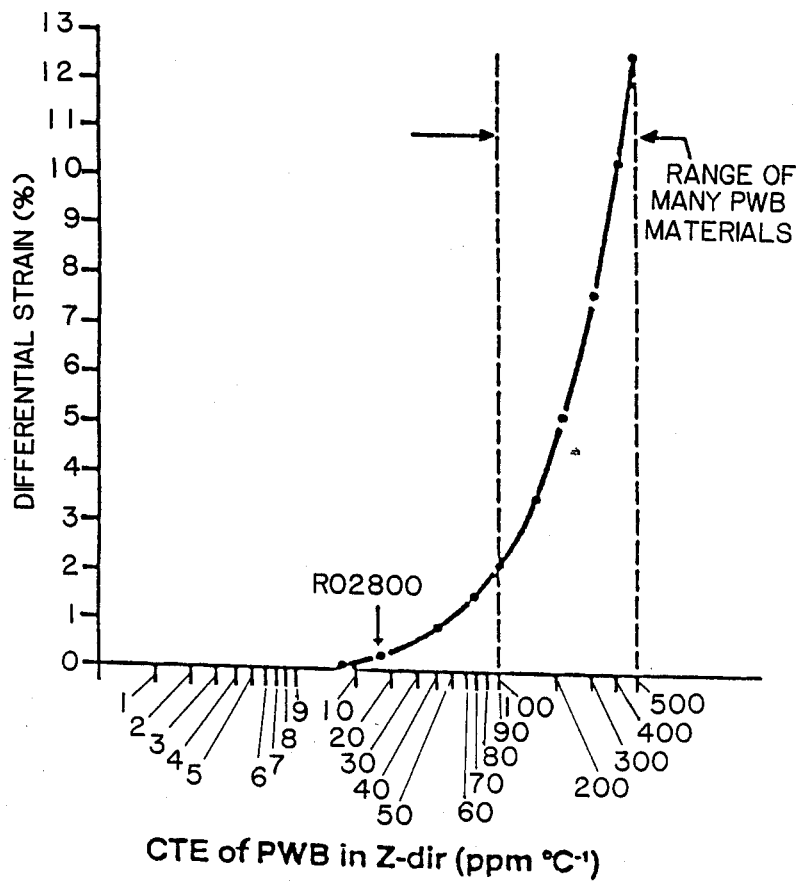
FIG. 11 is a graph of differential strain versus CTE in the Z direction for several PWB materials.

FIG. 11 is a graphical representation of the effect of substrate CTE on plated through hole (PTH) reliability. In FIG. 11, a plot of differential strain versus CTE of the PWB in the Z-direction is shown. For a ΔT of 263° C., differential strains for most PWB materaisl will lie between 2 and 13%; for RO-2800, this value is less than 1%.

Primarily due to its lower dielectric constant and lower dissipation factor (especially at high frequencies), the PWB substrate material of the present invention exhibits improved electrical performance over other materials being considered for high speed digital applications. A PWB material that offers designers improved electrical performance, and a substrate suitable for SMT with reliable plated through holes will go a long way toward optimizing the interconnection system, complementing the performance of high speed logic devices.

Other features and advantages of the present invention are summarized in the following TABLE 9.

TABLE 9

| FEATURE | BENEFITS OVER PRIOR ART |
|---|---|
| Low dielectric constant | High propagation velocity (as much as 25% higher) |
| | Low cross-talk (as much as an order of magnitude lower) |
| | Reduced Multilayer board thicknesses |
| Low loss at high frequencies | Lower rise-time degradation (by as much as 4 times) |
| | Suitable for microwave use |
| Low CTE X-Y plane, compliant | Suitable for surface mount technology |
| Low CTE Z-direction | Excellent plated through hole reliability |
| Excellent $\epsilon_r$ and thickness control | Improved Zo control |
| Higher thermal conductivity | Better power dissipation |

Finally, it is clear from the foregoing data and comparisons that while some PWB substrates have better electrical properties than RO-2800 (e.g. PTFE/Glass) and some PWB substrates have better thermal expansion properties than RO-2800 (e.g. polyimide/quartz, and polyimide/Kevlar), none of these prior art electrical substrate materials have as good combined electrical and thermo-mechanical properties which make them well suited for the next generation of high speed electronic components as well as surface mount technology.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. An electrical substrate material comprising:
   fluoropolymeric material;
   ceramic filler material, said filler material being in an amount of at least about 55 weight percent of the total substrate material;
   said ceramic filler being coated with a silane coating;
   at least one layer of metal being disposed on at least a portion of said electrical substrate material.

2. The material of claim 1 including:
   fiber reinforcement material.

3. The material of claim 2 wherein:
   said fiber reinforcement material has a weight percent of equal to or less than 2%.

4. The material of claim 2 wherein:
   said fiber reinforcement material is glass fiber.

5. The material of claim 4 wherein:
   said glass fiber is microglass fiber.

6. The material of claim 1 wherein said fluoropolymeric material is selected from the group comprising:
   polytetrafluoroethylene, hexa fluoropropene, tetrafluoroethylene or perfluoro alkyl vinyl ether.

7. The material of claim 1 wherein said ceramic filler comprises silica.

8. The material of claim 7 wherein said silica comprises amorphous fused silica powder.

9. The material of claim 1 wherein said silane coating is selected from the group comprising:
   p-chloromethyl phenyl trimethoxy silane, amino ethyl amino trimethoxy silane, a mixture of phenyl trimethoxy silane and amino ethyl amino propyl trimethoxy silane.

10. The material of claim 1 wherein:
    said silane coating is in an amount of at least 1 weight percent relative to the weight of the ceramic filler.

11. The material of claim 1 wherein said ceramic filler comprises particles and wherein the mean particle size varies from about 10 to 15 μm.

12. In a multilayer circuit including at least a first circuit layer and a second circuit layer, the improvement comprising:
an adhesive layer sandwiched between the first and second circuit layers, said adhesive layer comprising:
fluoropolymeric material;
ceramic filler material, said filler material being in an amount of at least about 55 weight percent of the total adhesive layer; and
said ceramic filler being coated with a silane coating.

13. The multilayer circuit of claim 12 including:
at least one plated through hole.

14. The multilayer circuit of claim 12 including:
fiber reinforcement material.

15. The multilayer circuit of claim 14 wherein:
said fiber reinforcement material has a weight percent of equal to or less than 2%.

16. The multilayer circuit of claim 14 wherein:
said fiber reinforcement material is glass fiber.

17. The multilayer circuit of claim 16 wherein:
said glass fiber is microglass fiber.

18. The multilayer circuit of claim 12 wherein said fluoropolymeric material is selected from the group comprising:
polytetrafluoroethylene, hexa fluoropropene, tetrafluoroethylene or perfluoro alkyl vinyl ether.

19. The multilayer circuit of claim 12 wherein said ceramic filler comprises silica.

20. The multilayer circuit of claim 19 wherein said silica comprises amorphous fused silica powder.

21. The multilayer circuit of claim 12 wherein said silane coating is selected from the group comprising:
p-chloromethyl phenyl trimethoxy silane, amino ethyl amino trimethoxy silane, a mixture of phenyl trimethoxy silane and amino ethyl amino propyl trimethoxy silane.

22. The multilayer circuit of claim 12 wherein:
said silane coating is in an amount of at least 1 weight percent relative to the weight of the ceramic filler.

23. The multilayer circuit of claim 12 wherein said ceramic filler comprises particles and wherein the mean particle size varies from about 10 to 15 $\mu$m.

24. An electrical substrate material comprising:
fluoropolymeric material;
ceramic filler material, said filler material being in an amount of at least about 50 volume percent of the total substrate material;
said ceramic filler being coated by a silane coating; and
at least one layer of metal being disposed on at least a portion of said electrical substrate material.

25. The material of claim 24 including:
fiber reinforcement material.

26. The material of claim 25 wherein:
said fiber reinforcement material is glass fiber.

27. The material of claim 26 wherein:
said glass fiber is microglass fiber.

28. The material of claim 24 wherein said fluoropolymeric material is selected from the group comprising:
polytetrafluoroethylene, hexa fluoropropene, tetrafluoroethylene or perfluoro alkyl vinyl ether.

29. The material of claim 28 wherein said ceramic filler comprises silica.

30. The material of claim 29 wherein said silica comprises amorphous fused silica powder.

31. The material of claim 24 wherein said silane coating is selected from the group comprising:
p-chloromethyl phenyl trimethoxy silane, amino ethyl amino trimethoxy silane, a mixture of phenyl trimethoxy silane and amino ethyl amino propyl trimethoxy silane.

32. The material of claim 24 wherein said ceramic filler comprises particles and wherein the mean particle size varies from about 10 to 15 $\mu$m.

33. In a multilayer circuit including at least a first circuit layer and a second circuit layer, the improvement comprising:
an adhesive layer sandwiched between the first and second circuit layers, said adhesive layer comprising:
fluoropolymeric material;
ceramic filler material, said filler material being in an amount of at least about 50 volume percent of the total adhesive layer; and
said ceramic filler being coated with a silane coating.

34. The multilayer circuit of claim 33 including:
at least one plated through hole.

35. The multiplayer circuit of claim 33 including:
fiber reinforcement material.

36. The multilayer circuit of claim 35 wherein:
said fiber reinforcement material is glass fiber.

37. The multilayer circuit of claim 36 wherein:
said glass fiber is microglass fiber.

38. The multiplayer circuit of claim 33 wherein said fluoropolymeric material is selected from the group comprising:
polytetrafluoroethylene, hexa fluoropropene, tetrafluoroethylene or perfluoro alkyl vinyl ether.

39. The multilayer circuit of claim 33 wherein said ceramic filler comprises silica.

40. The multilayer circuit of claim 39 wherein said silica comprises amorphous fused silica powder.

41. The multilayer circuit of claim 33 wherein said silane coating is selected from the group comprising:
p-chloromethyl phenyl trimethoxy silane, amino ethyl amino trimethoxy silane, a mixture of phenyl trimethoxy silane and amino ethyl amino propyl trimethoxy silane.

42. The multilayer circuit of claim 33 wherein said ceramic filler comprises particles and wherein the mean particle size varies from about 10 to 15 $\mu$m.

* * * * *